(12) United States Patent
Chew et al.

(10) Patent No.: US 7,739,627 B2
(45) Date of Patent: Jun. 15, 2010

(54) SYSTEM AND METHOD OF MAXIMIZING INTEGRATED CIRCUIT MANUFACTURING YIELD WITH CONTEXT-DEPENDENT YIELD CELLS

(76) Inventors: Marko P. Chew, 3270 South Court, Palo Alto, CA (US) 94306; Yue Yang, 8153 Park Villa Cir., Cupertino, CA (US) 95014

( * ) Notice: Subject to any disclaimer, the term of this patent is extended or adjusted under 35 U.S.C. 154(b) by 317 days.

(21) Appl. No.: 11/824,758

(22) Filed: Jul. 2, 2007

(65) Prior Publication Data
US 2008/0022235 A1    Jan. 24, 2008

Related U.S. Application Data

(60) Provisional application No. 60/818,724, filed on Jul. 5, 2006.

(51) Int. Cl.
*G06F 17/50* (2006.01)
(52) U.S. Cl. .......................... 716/2; 716/10
(58) Field of Classification Search ............... 716/2, 716/4, 8–18
See application file for complete search history.

(56) References Cited

U.S. PATENT DOCUMENTS

| | | | |
|---|---|---|---|
| 6,851,101 B1* | 2/2005 | Kong et al. | 716/12 |
| 2005/0114824 A1* | 5/2005 | Wang et al. | 716/21 |
| 2005/0246674 A1* | 11/2005 | Scheffer | 716/8 |
| 2008/0028353 A1* | 1/2008 | Lu et al. | 716/13 |

* cited by examiner

*Primary Examiner*—Stacy A Whitmore

(57) ABSTRACT

A system and a method of creating context dependent yield variants of integrated circuit ("IC") design components and using these variants during a physical design of an IC block to maximize manufacturing yield are described. A plurality of variants of each design component is generated and characterized with manufacturing yield as a function of neighboring context ("context") that includes, but is not limited to, neighboring design components and other layout objects and shapes. The present invention describes a system and method where a physical design process, in addition to satisfying design and performance requirements such as, but not limited to, power, timing, signal integrity and minimal layout area, selects context dependent yield variants to maximize manufacturing yield.

20 Claims, 19 Drawing Sheets

SYSTEM AND METHOD OF MAXIMIZING INTEGRATED CIRCUIT MANUFACTURING YIELD WITH CONTEXT-DEPENDENT YIELD CELLS

CLAIM OF BENEFIT TO PROVISIONAL APPLICATION

This patent application claims the benefit of the earlier filed U.S. Provisional Patent Application entitled "System and method of maximizing integrated circuit manufacturing yield with context-dependent yield cells", having Ser. No. 60/818, 724, and filed Jul. 5, 2006.

TECHNICAL FIELD OF APPLICATION

This invention relates generally to the design and manufacture of integrated circuits ("IC") and more particularly to a system and method of generating IC context dependent yield variant components and of using these yield variants during physical design of IC block to maximize manufacturing yield.

BACKGROUND OF THE INVENTION

An integrated circuit (IC) can be considered to be a graph of connected primitives such as, but not limited to, transistors and resistors. Such an entity is commonly referred to as a netlist. Each primitive is mapped to one or more layout objects that are two-dimensional geometrical objects such as, but not limited to, rectangles, polygons, and paths. In turn, these layout objects are used to define regions within a semiconductor die, which will receive different processing steps such as dopant, implants to produce N-type or P-type regions during the integrated circuit fabrication process.

Ultimately, every netlist must be mapped to an IC design layout ("layout") prior to its manufacture. IC designers typically use electronic design automation ("EDA") applications to create a layout. These EDA applications provide sets of computer-based tools for creating, editing, and analyzing layouts.

EDA applications create layouts from a netlist by various operations. Some, but not all, of a physical design ("PD") operations need to transform a netlist to a layout include: (1) placement which specifies locations of the IC components; (2) routing which generates layout objects to connect IC components; (3) additional operations to complete a layout such as, but not limited to adding substrate/well contacts and power/ground routing. The result of the physical design process is a layout.

A netlist can be partitioned into clusters of functional blocks ("blocks") such as logic, memory, analog and other functions. Since interface specifications for interactions among blocks are usually well defined, different IC designers can create each block independently and concurrently. IC designers create these blocks by assembling pre-built design components ("components") using EDA applications. These components are stored in a design component library ("DCL") and contain pre-characterized data called views such as, but not limited to, layout, logic, timing, power and other data views, required by EDA applications.

FIG. 1 illustrates some embodiments of a physical design process 1010 for a block. The process starts at 1040 by accepting a block specification 1030 and selecting components from a pre-built Design Component Library 1020. At 1050, the process computes component locations ("placement") and then generates the required component interconnections at 1060_("routing"). The result is a block 1070 composed of placed and interconnected components.

FIG. 2 illustrates some embodiments of an IC logic block composed of placed and routed components which are called standard cells. A standard cell implements a basic logic function and is stored in a pre-built standard cell library. All cells in a standard cell library conform to a certain set of standard requirements, including physical dimensions, electrical characteristics, etc. The physical design process places standard cell components in a two-dimension plane representing an IC chip and then generates interconnection among them. Such a physical design flow is called an application specific integrated circuit ("ASIC") flow. 210 is a representative standard cell component while 220 is a representative interconnection or routing among components.

FIG. 3 illustrates some embodiments of a physical design process 300 to generate an ASIC IC block. A standard cell library 310 contains basic design components, implemented as layout, logic, timing, power and other data views. Logic or physical synthesis tools 312, such as Synopsys Physical Compiler, transfer the logic description of the design 302 into a netlist 304 of logic views of cells; then placement tools 314, such as Cadence Encounter, transfer the netlist into a placed design in which cells are placed within a die area; then routing tools 316, such as Cadence Encounter, transfer a placed design to a IC mask layout 308 by generating required connections among cells. Both 314 and 316 use the layout view of the cells.

FIG. 4 illustrates some embodiments of an IC memory block composed of a bit-cell array and peripheral ("periphery") blocks. 430 is a bit cell array which contains IC components providing the memory functionality. Periphery 410, 420 and 440 contain circuitry to read and write information to and from the bit cell array. Periphery 450 and 460 are so called dummies blocks required to be present during a manufacturing process. The design of the bit-cell array and individual bit cells uses very specialized techniques to ensure that these structures are manufacturable with smallest layout area and is beyond the scope of this document. Peripheries, however, are implemented in a similar fashion as a logic block flow. Bit slice components are placed and routed to form a particular periphery such as, but not limited to, an address decode block. These bit slice components are stored in a collection analogous to a standard cell library.

The construction of the memory peripheral block is done either manually by a human designer or by a specialized EDA tool called a memory compiler. The operation to create a periphery is similar to that of an ASIC flow. FIG. 5 illustrates some embodiments of a process 510 used to generate a memory block. The process at 524 computes a memory architecture required for the memory requirement 520. At 528 the process selects a periphery to generate. At 532 the process computes the periphery parameters based on the memory architecture determined in 524. At 536 the process selects a set of bit slice components, places them in 540, and generates interconnections at 544. At 548 the process determines if there are any additional peripheries to be generated. If there are additional peripheries to be generated, the process returns to 528 to select another periphery to generate. If there are no more peripheries to be generated, the process produces the memory block at 552.

The quality of the components used to create the IC blocks is the primary determinant of the final IC design quality. Therefore, significant amount of resources are invested in the optimization of the components. The optimization objectives for the creation of the components include such aspects, but are not limited to, layout area, timing, power and signal integrity.

Each component is typically optimized individually with the assumption that electrically isolated neighboring components will have limited impact on the component eventual performance. For example, physical IP vendors like ARM optimize standard cells without considering context dependencies. Normally several versions of cell libraries are made for each process node to accommodate special needs for power consumption, speed or other user requirement.

Similar efforts are undertaken to design components comprising various memory peripheral blocks. For example, many variants of bit slice components for an address decode block are created to accommodate different configuration of bit cell arrays that a decode block might connect to. These variants are necessary since different bit cell array configuration have different electrical characteristics that must be accommodated in a particular bit-cell array configuration to order to satisfy performance requirements. These pre-built components are then selected by either a memory designer or an EDA memory compiler tool to construct a particular variant of a memory block.

IC fabrication is an extremely complex manufacturing process. Numerous manufacturing related considerations such as, but not limited to, lithography, etch, deposition and chemical mechanical polishing affect the final quality of the manufactured IC. Traditionally IC designers have not had to consider the manufacturing considerations during the design process; however, starting at the 130 nm process node, manufacturing considerations have started to impact negatively fabricated IC circuit performance relative to design requirements.

The manufacturing yield of an IC is defined to be the percentage of manufactured ICs meeting the product requirements. Examples of product requirements include, but are not limited to, functional correct operations at the specified clock frequency range and power dissipation below a specified value. The manufacturing yield is impacted by such considerations, but is not limited to, as the inherent variations of the IC manufacturing process, the semiconductor electrical property variations due to proximity effects such as STI stress and orientation relative to intentionally introduced stress structures, lithographic context dependent printability, and localized chemical mechanical polish (CMP) effects.

It has been recognized that variants of integrated circuit components dependent on different manufacturing considerations could be provided to designers so that the tradeoffs regarding yield and circuit performance can be made. Current approaches provide yield component variants that are developed and characterized in isolation without regard to neighboring context. A neighboring context ("context") is defined to be the surrounding layout regions of a particular component during fabrication as well as during a component's operational mode. Physical design tools using components characterized for yield without regard to the context may not improve the yield, and sometimes even reduces it.

SUMMARY OF THE INVENTION

In view of the foregoing background, it is therefore an object of the present invention to have a design component's manufacturing yield value be a function of the context rather than a fixed value.

Another object of the present invention is to augment a DCL with an extended design component library ("ECL") with variants whose manufacturing yield value is context dependent rather than be a fixed value.

A further object of the present invention is to allow a physical design of IC blocks to utilize an ECL as well as a DCL to maximize a block's yield through the use of using yield variants while abiding with design and performance goals. In some embodiment of the present invention, for IC blocks implemented by assembling pre-built design components, a plurality of variants are created and characterized for yield value as a function of different context. In turn, the physical design process can query a component's yield value as function of its current context so as to allow yield to be included in a physical design optimization objectives such as, but not limited to, power, timing, and signal integrity.

The present invention is unique in describing a flow where context dependent yield variants are created and then used during a physical design process. In such a flow, a component variant's yield value is a function of its context rather than a fixed number. A physical design process can query the expected yield of a design component during the course of its execution as the component's context is changed.

DETAILED DESCRIPTION

In the following description, numerous details are set forth for purpose of explanation. However, one of skill in the art will realize that the invention may be practiced with variations of these specific details. In other instances, well-known structures or operations are not shown in detail to avoid obscuring the invention.

Computing Environment

Figure 6:
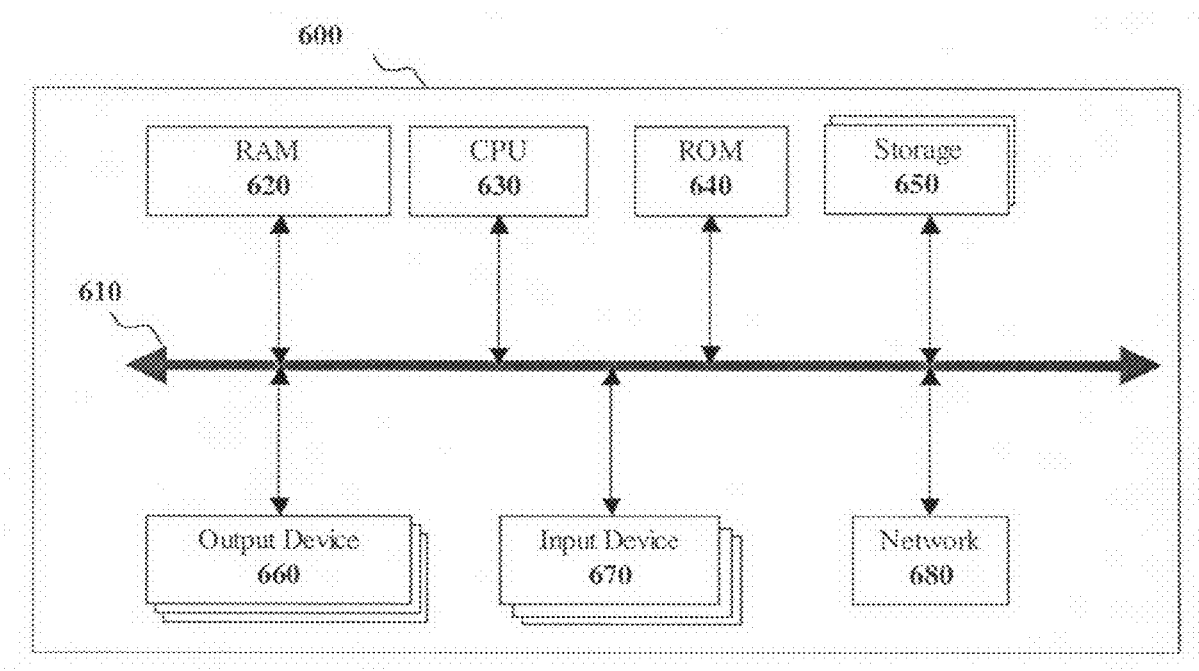
FIG. 6 illustrates a computing environment for the present invention.

FIG. 6 illustrates a block diagram of the computing environment that one embodiment of the present invention is implemented. Even though the computer system is described with specific components and architecture for illustration, it should be understood that the present invention might be implemented in several other types of embodiments. For example, the invention can be implemented on single computer with a processor chip containing 2 or more processor cores with each core containing additional hardware to maintain state of two or more threads of execution. In addition, each component can be implemented as a combination of one or more of hardware, software and firmware, even though many features of the present invention are described herein as being implemented in software.

The computing environment 600 may contain one or more components such as a communication fabric 610, random access memory (RAM) 620, central processing unit (CPU) 630, read only memory 640 (ROM), secondary memory (Storage) 650, output devices 660, input devices 670, network interface 680. All the components may communicate with each other over communication fabric 610. The communication fabric 610 collectively represents all systems, peripherals, chipset buses and all other communication pathways that can connect the components of the computing environment 600. The components of FIG. 6 are described below in further detail.

CPU 630 retrieves the instructions and data to process in order to execute the processes of this invention from the various storage components of computing environment 600. The ROM 640 stores the static instruction and data not modified during normal operation and are needed by CPU 630 and any other component of the computing environment 600. Read-write memory (RAM) 620 is a volatile storage that requires power to be supplied to store the instructions and data. Storage 650 is nonvolatile storage that doesn't need power to store instructions and data. In some embodiments, storage 650 use fixed mass-storage devices such as disk drives. Other embodiments use removal mass-storage devices such as removable disk drives. The RAM 620 stores some of the instructions and data that the CPU 630 needs. In some embodiments, the invention's processes are stored in the CPU 630, RAM 620, ROM 640, and/or storage 650.

The input device 670 enables the user to issue commands to the computing environment. Examples of an input device 670 include but are not limited to, keyboards, mouse, and/or tablet and stylus. The output device 660 is used to display images generated by the computing environment.

Network interface 680 may be implemented using protocols such as TCP/IP, ATM and/or Ethernet. In this manner, the computer can be a part of a network of computers (such as a local area network ("LAN"), a wide area network ("WAN"), or an Intranet) or a network of networks (such as the Internet). Any, some or all of the components of computing environment 600 may be used in conjunction with the invention. However, one of ordinary skill in the art would appreciate that any other system configuration may also be used in conjunction with the present invention.

As noted above, CPU 630 may retrieve the software instructions, and execute the instructions to provide various features of the present invention. The features of the present invention are described below in further detail.

General Overview

It is an object of the present invention to have a design component's manufacturing yield value be a function of the context rather than a fixed value.

The present invention augments a DCL with an ECL with yield variants whose manufacturing yield value is context dependent rather than be a fixed value.

The present invention, in turn, allows physical design of IC blocks to utilize an ECL as well as a DCL to maximize a block's yield through the use of using yield variants while abiding with an IC block's design and performance goals. In some embodiment of the present invention, for IC blocks implemented by assembling pre-built design components, a plurality of variants are created and characterized for yield value as a function of different context. In turn, the physical design process can query a component's yield value as function of its current context so as to allow yield to be included in a physical design optimization objectives such as, but not limited to, power, timing, and signal integrity.

In one embodiment for creating memory blocks, physical design tools are able to select an optimized set of context dependent yield variants for bit slice components when generating peripheries for a memory block.

In another embodiment for a standard cell with certain electrical characteristics, a plurality of yield variants are generated and the yield value as a function of different context is characterized. Placement and routing EDA tools can query a standard cell yield variant's expected yield value as a function of the context and incorporate the value when considering the other physical design optimization objectives. These EDA tools can then selectively swap out different yield variants if necessary to increase the manufacturing yield.

Conceptual Flow

Figure 7:
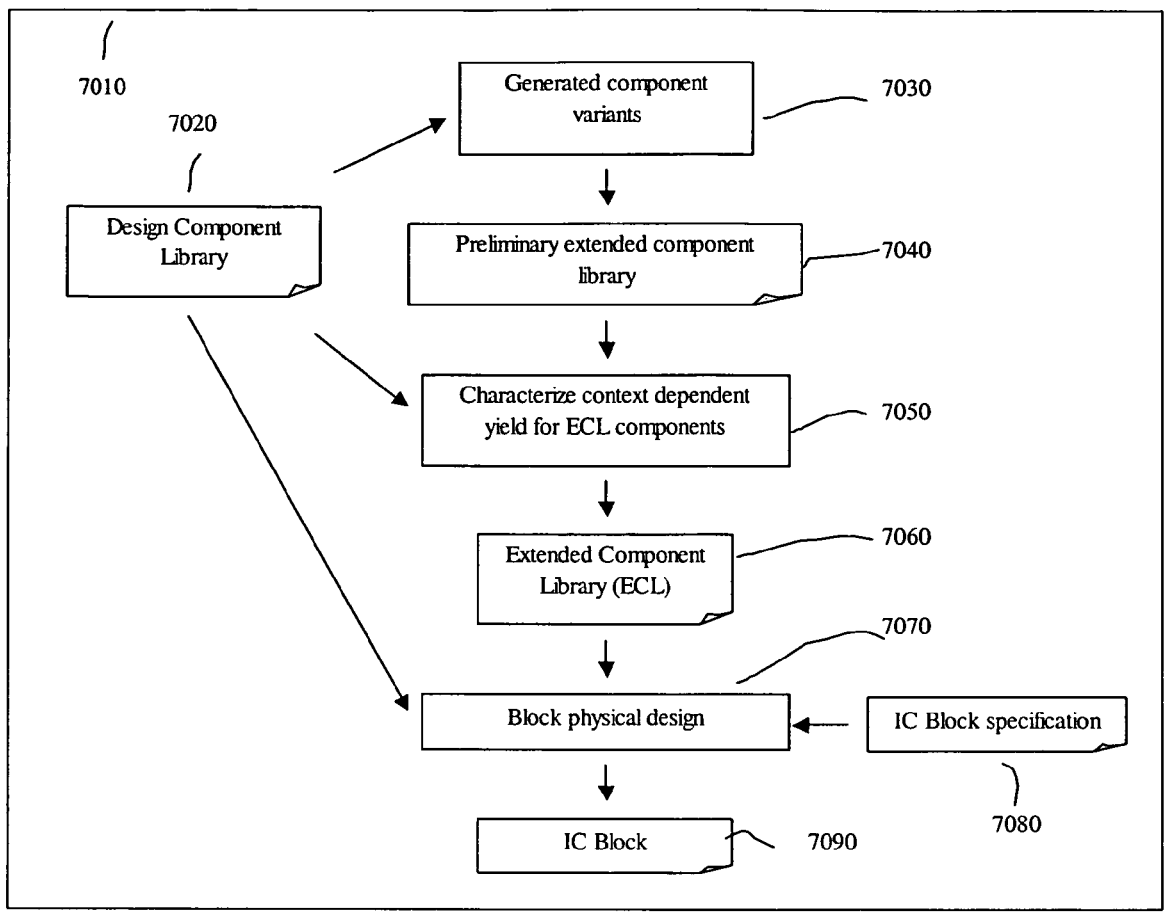
FIG. 7 illustrates some embodiment of a process implementing the conceptual flow of the present invention.

FIG. 7 illustrates some embodiment of a process 7010 for a conceptual flow of the present invention. The process starts at 7030 by generating variants for each component in a DCL 7020 which contains the pre-constructed design components and places generated variants in a preliminary ECL 7040. At 7050, the process characterizes the yield value for each preliminary ECL as a function of different context provided by components from a DCL and preliminary ECL and stores characterized yield function in a completed ECL 7060. The physical design process at 7070 accepts IC block specifications 7080 along with a DCL 7020 and ECL 7060 and generates an IC block 7090 with a maximal yield value subject to other IC block requirements.

Component Variant Generation

Figure 8:
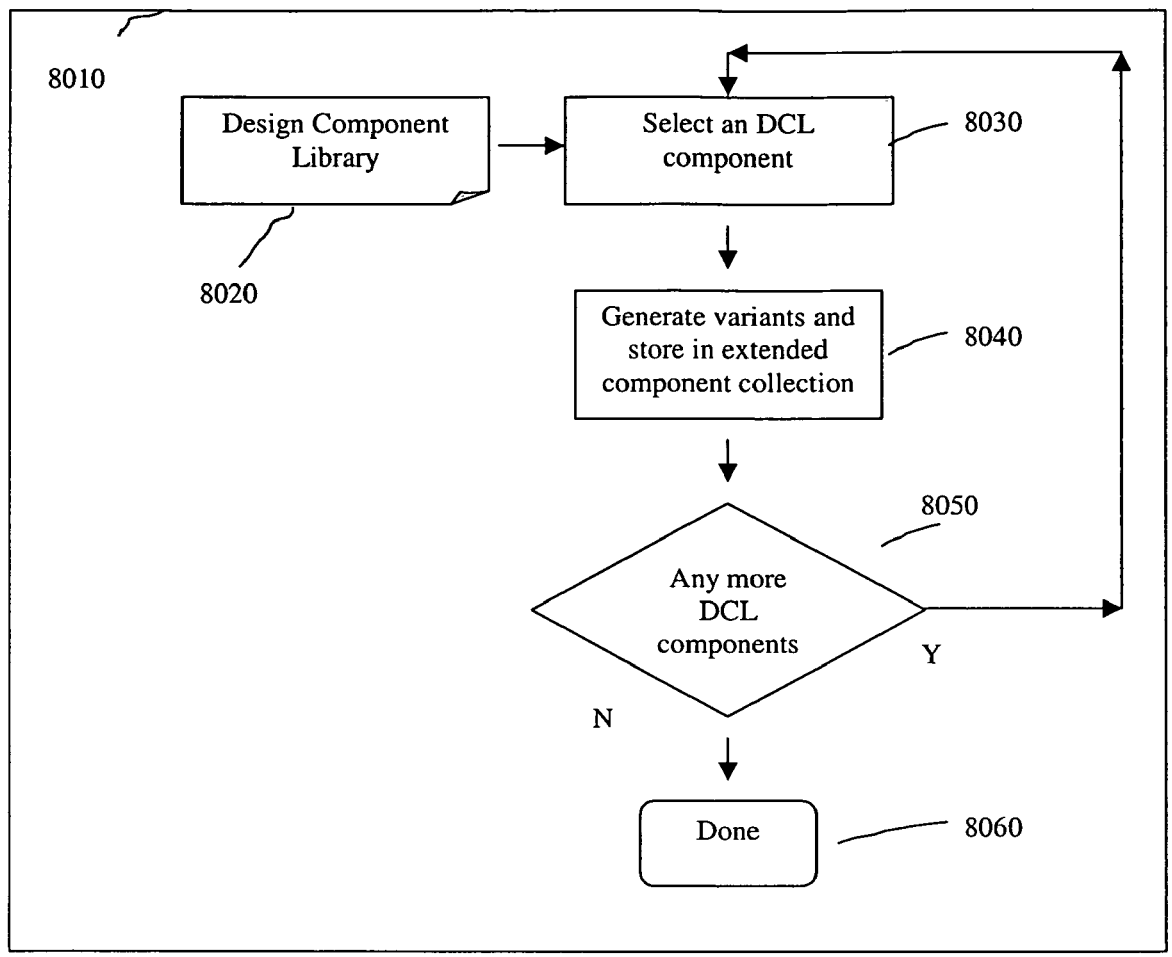
FIG. 8 illustrates some embodiment of a process used to generate component variants for the extended component library.

FIG. 8 illustrates some embodiment of a process 8010 for creating variants of DCL components. The process at 8030 selects a DCL component. At 8040, the process generates variants of the selected DCL component. In some embodiments, variants are generated using a wide variety of methods such as, but not limited to, More conservative manufacturing rules such as treating recommended rules as mandatory required rules.

Different layout topologies generated either using manual effort or EDA applications but keeping the electrical performance and functional behavior the same as its corresponding DCL component.

Selective enforcement of some but not all recommended rules.

Incorporate yield learning or yield ramp data to from such sources as, but not limited to, test chips, device and/or process simulations, actual IC development or production fabrication data, and any other sources of IC manufacturing yield information.

At 8050, the process determines if there are additional DCL components from which variants haven't been generated. If there are some DCL components with no variants, the process returns to 8030 to select another DCL component. If all the DCL components have been examined, the process exits at 8060.

Context-Dependent Yield Characterization

A design component's context is the shapes within certain distance of its boundary. This distance is determined by specifics of fabrication process being considered. Lithography related yield is only relevant within 5 times wavelength of the light used by the stepper. For the currently widely used 193 nm laser, this distance is around 1 um. The defect-dependent random yield impact is determined by a characteristic process particle size distribution. The yield impact dependent on mechanical mechanism such as CMP has a much larger scope, it is preferably considered during routing process. This context locality has important implications during yield characterization of design components.

Figure 9:
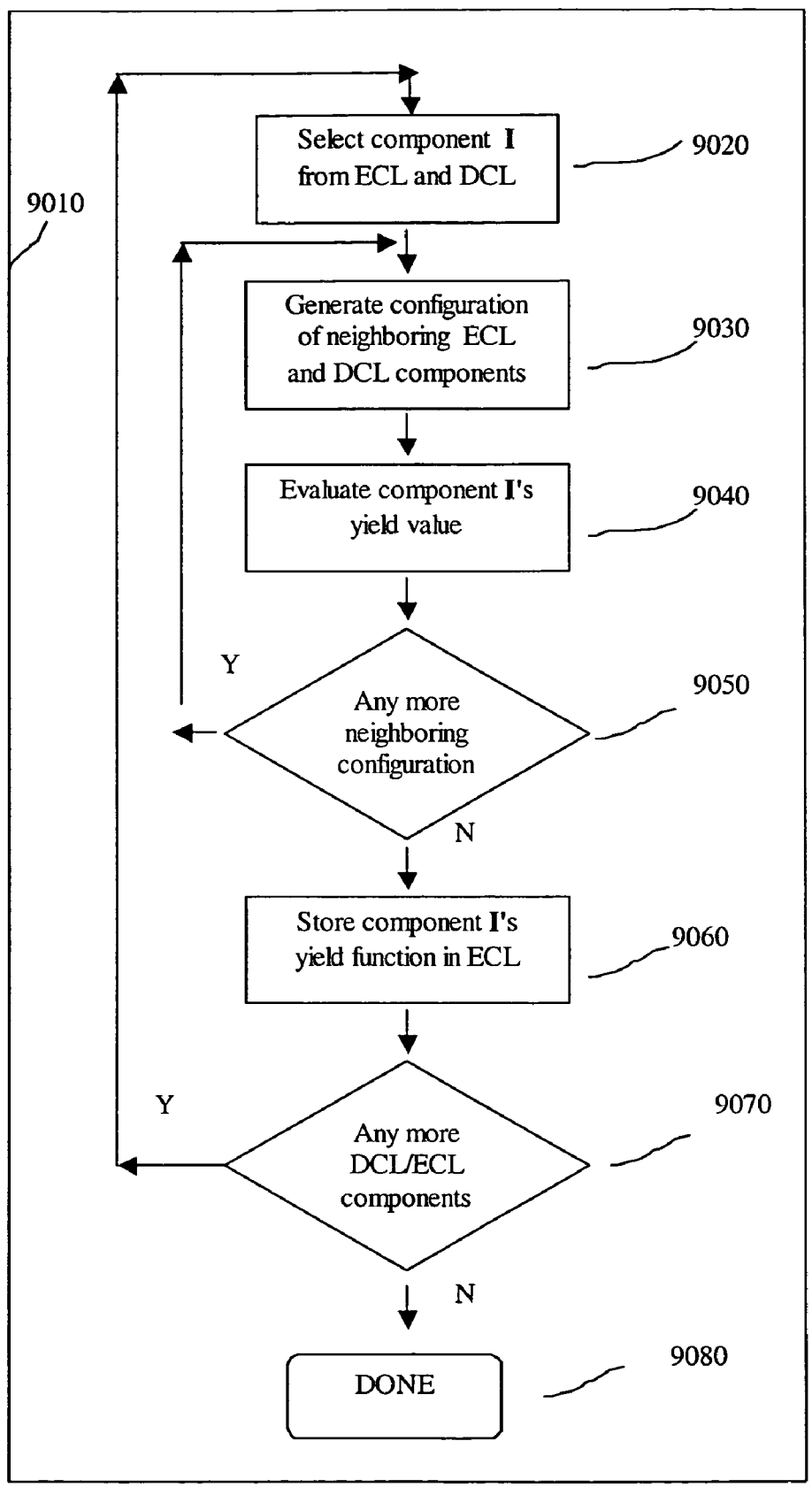
FIG. 9 illustrates some embodiment of a process used to characterize a component's context dependent yield function.

FIG. 9 illustrates some embodiments for a process 9010 for characterizing context dependent yield for DCL and ECL components. The process at 9020 selects a component, say I, from either the ECL or DCL. At 9030, the process generates a context by surrounding component I completely with ECL and DCL components. At 9040, the process evaluates the manufacturing yield of component I, based on the current context. In some embodiments, the manufacturing yield value could be generated from several methods such as, but not limited to:

Printability based on lithography simulation incorporating such items, but not limited to, an aerial imaging and resist modeling across nominal and different process latitude conditions.

Device parameter variations due to neighboring context conditions altering localized IC fabrication process environmental conditions.

Inter layer dielectric ("ILD") variability to due to chemical mechanical polishing (CMP) variability.

Reticle enhancement technology ("RET") hot spots where the layout doesn't have room to accommodate an RET feature.

Edge placement error ("EPE") after RET features have been inserted.

At 9050, the process determines if there are additional contexts to be evaluated and returns to 9030 to generate another context if so. If all possible contexts have been evaluated, the process stores a context dependent yield function in the ECL at 9060. At 9070, the process determines if there are additional DCL or ECL components with missing context dependent yield functions. If so, the process returns to 9020 to select another component. If all the DCL and ECL components have context dependent yield function, the process terminates at 9080.

Physical Design with Yield Variants

Figure 1:
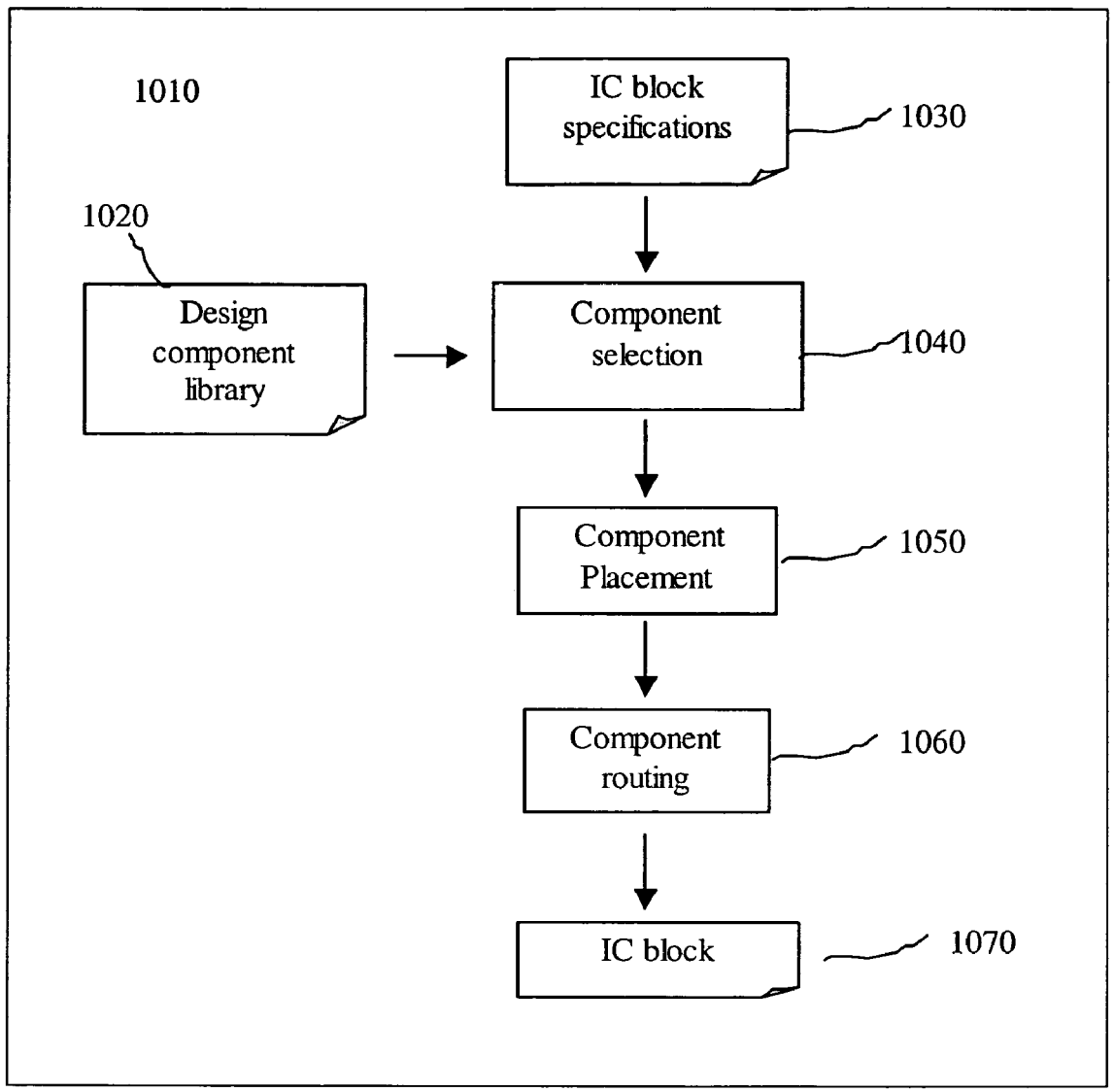
FIG. 1 illustrates some embodiment of a process for assembling pre-built design components to generate an IC block.
Figure 2:
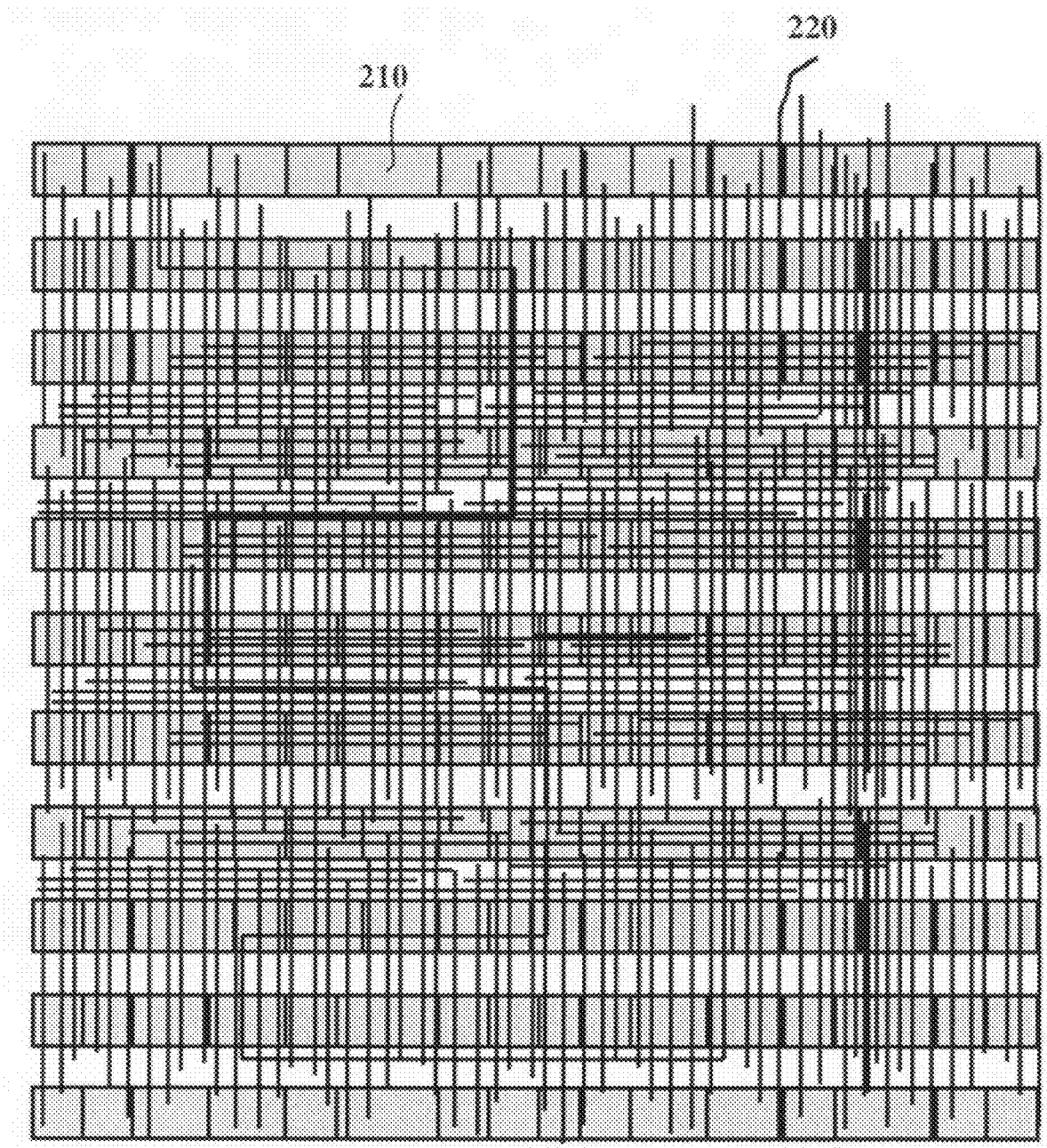
FIG. 2 illustrates an example of logic IC block produced by an ASIC flow.

As illustrated in FIG. 1, a prior art physical design process for generating an IC block first selects a DCL design components at 1040 and never alters a set of components through the remaining placement step at 1050 and routing step at 1060. This is due to underlying assumption that a component's yield value remaining constant during the remaining physical design process steps.

Figure 10:
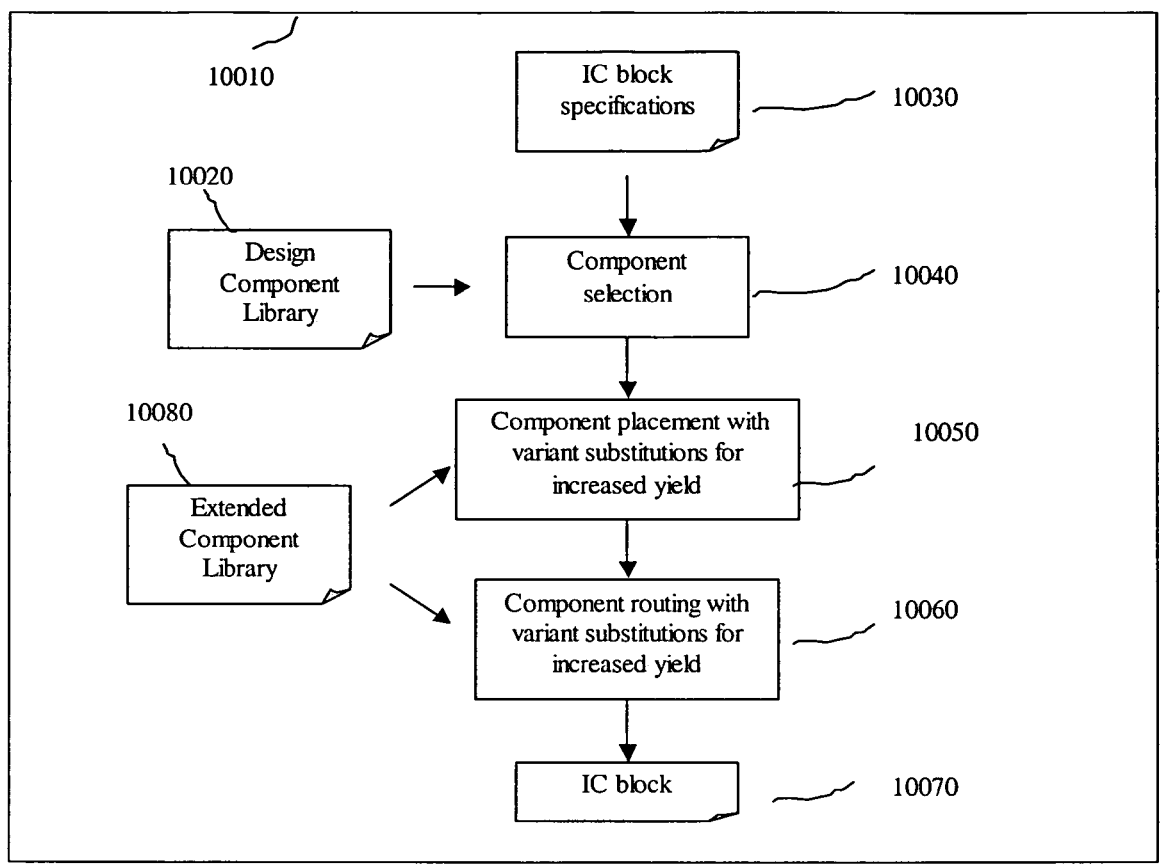
FIG. 10 illustrates some embodiment of a physical design process for the present invention using context dependent yield variants to increase the manufacturing yield.

In the present invention, the premise is that a component's yield value changes as different neighboring configurations or contexts are generated and modified during a physical design process. FIG. 10 illustrates some embodiments of context dependent yield physical design process 10010 for the present invention. This flow is similar to that illustrated in FIG. 1 at 10040 where components are select from a DCL 10020 based on the IC Block specification 10030. The difference is that component placement at 10050 can substitute component yield variants from an ECL 10080 whenever necessary to increase block's overall yield number during its operations. Likewise, at 10060 the Component Routing step can substitute yield variants from the ECL 10080 whenever necessary to increase a block overall yield number.

These substitutions of different context dependent yield variants occur whenever a component's context is altered during the normal operations of a physical design process and are in addition to the other physical design optimization such as, but not limited to, wire length minimization, congestion avoidance, and timing closure.

Figure 11:
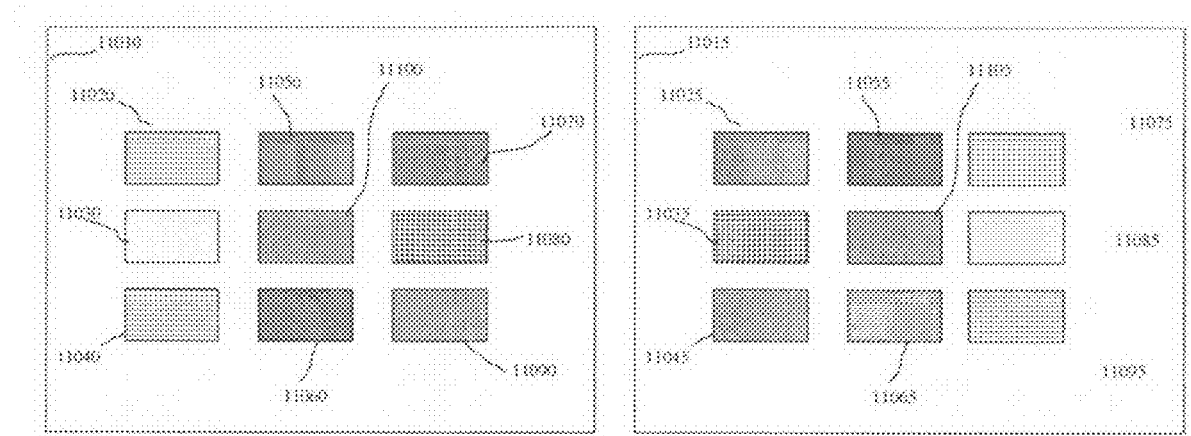
FIG. 11 illustrates an example where some embodiment of a physical design process alters neighboring context for a component.

FIG. 11 illustrates an example of an intermediate placement configuration 11010 for some embodiment of a physical design process. Component 11100's context is defined by components 11020-11090 so that its yield value is computed based on the context generated by these components. Some embodiments of a physical design process produces configuration 11015 where locations originally occupied by 11020-11090 are now occupied by components 11025-11095 while component 11100, which is now labeled 11105, occupies the same location as in configuration 11010. A physical design process would first compute a "goodness" value of the configuration 11015 based on existing art physical design optimization objectives and then factor in the new yield value for 11105 based on its new context. In this manner, the physical design process can factor in expected manufacturing yield for a new configuration as part of its optimization objective.

Figure 12:
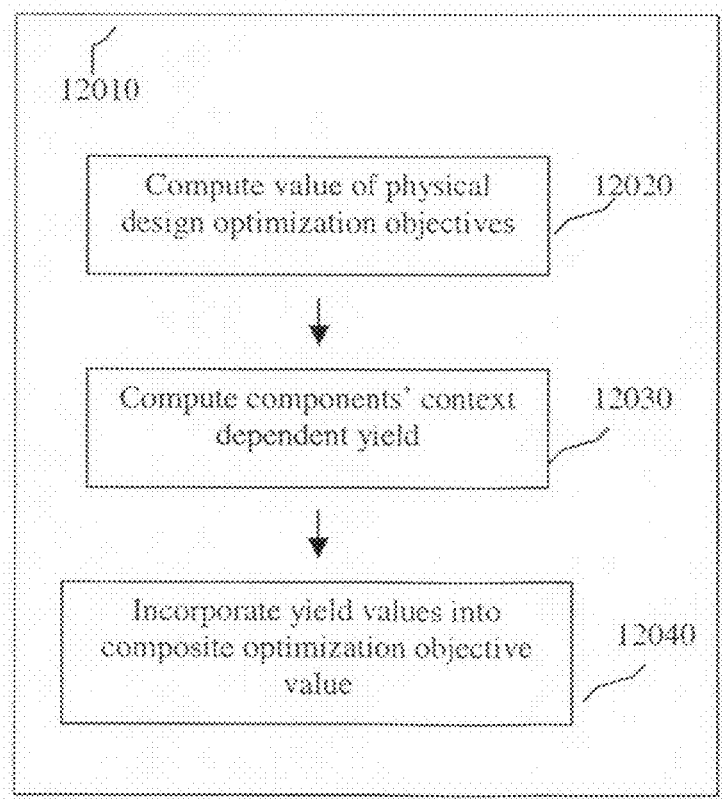
FIG. 12 illustrates some embodiment of physical design process incorporating component context dependent yield information into an optimization objective value.

FIG. 12 illustrates some embodiment of physical design optimization process 12010 to incorporate components' context dependent yield information. At 12020, the process computes a "goodness" value of the current physical design configuration with regards to optimization objectives using existing art approaches. At 12030, the process computes component's context dependent yield value using the system and method described in the present invention. At 12040, the process combines context yield values and existing art optimization objective value to form a composite optimization objective value. It is this new composite optimization value that allows physical design process to incorporate context dependent yield information.

Standard Cells

Some embodiments of the present invention utilize an ASIC physical design flow where design components are selected from a standard cell library. Such embodiments can take advantage of the special nature of standard cell architectures for computational efficiencies.

Standard Cell Flow

Figure 3:
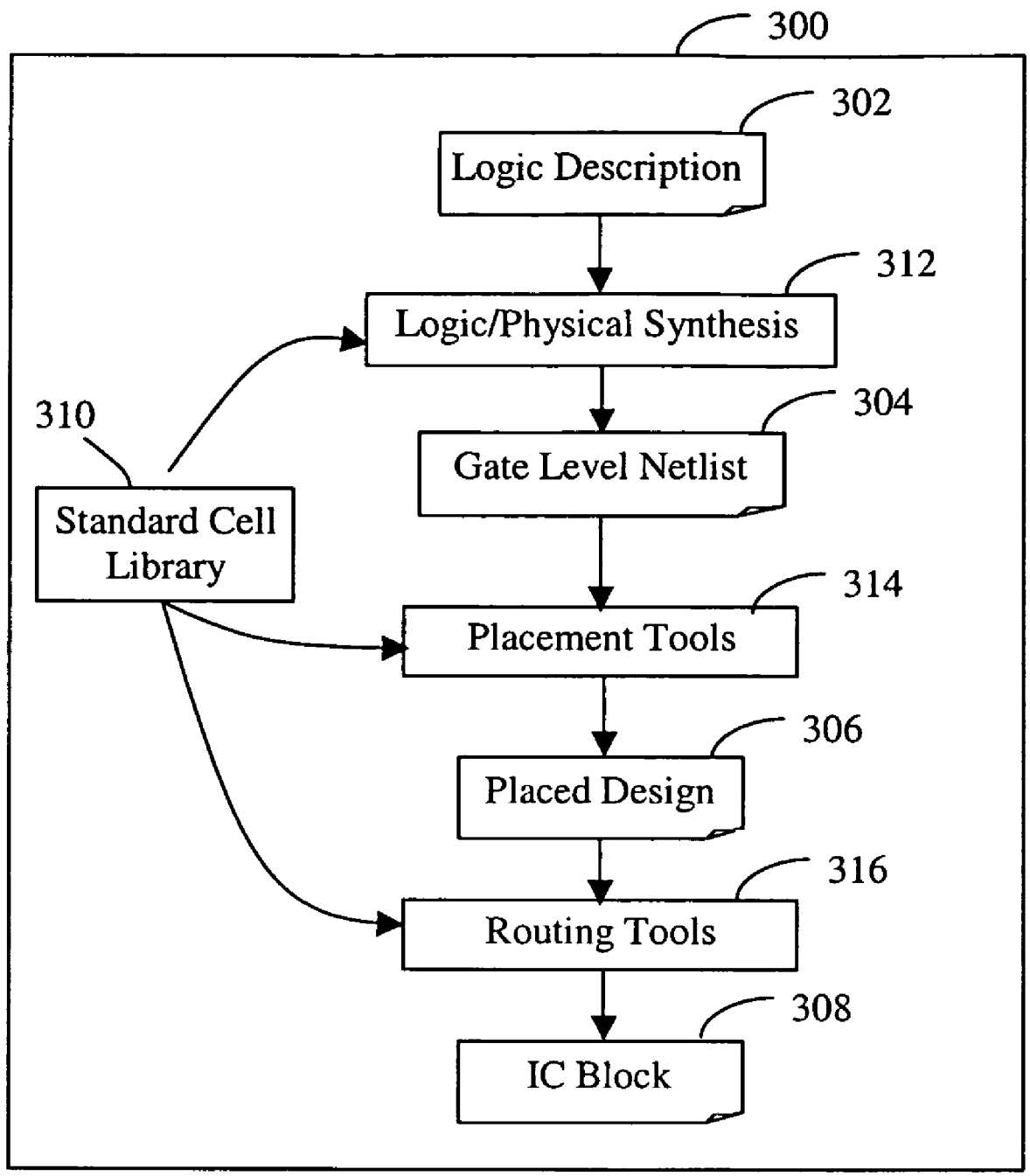
FIG. 3 illustrates some embodiment of physical design process using an ASIC flow to create an IC block.
Figure 4:
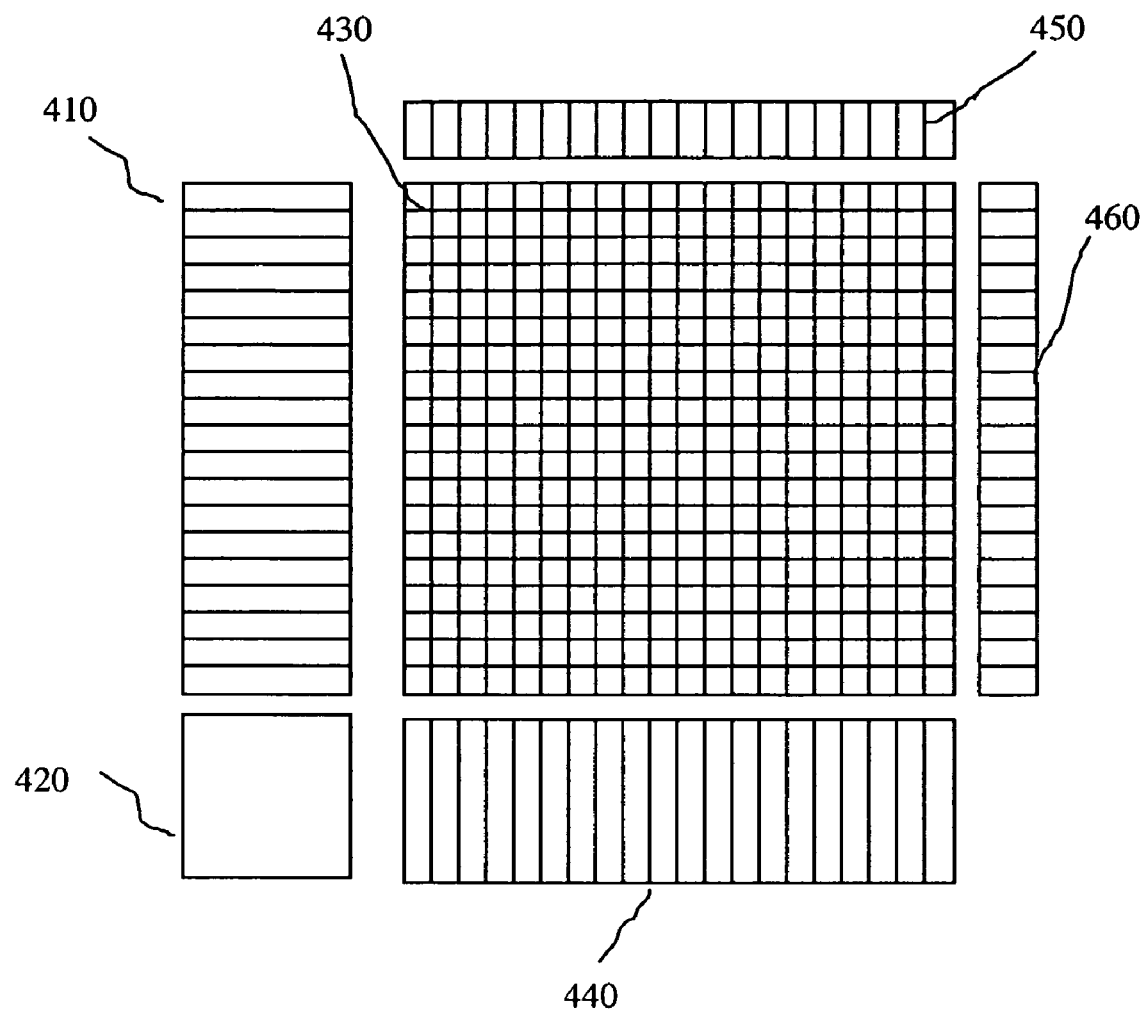
FIG. 4 illustrates some embodiment of a memory block composed of bit cell array and peripheral blocks.
Figure 13:
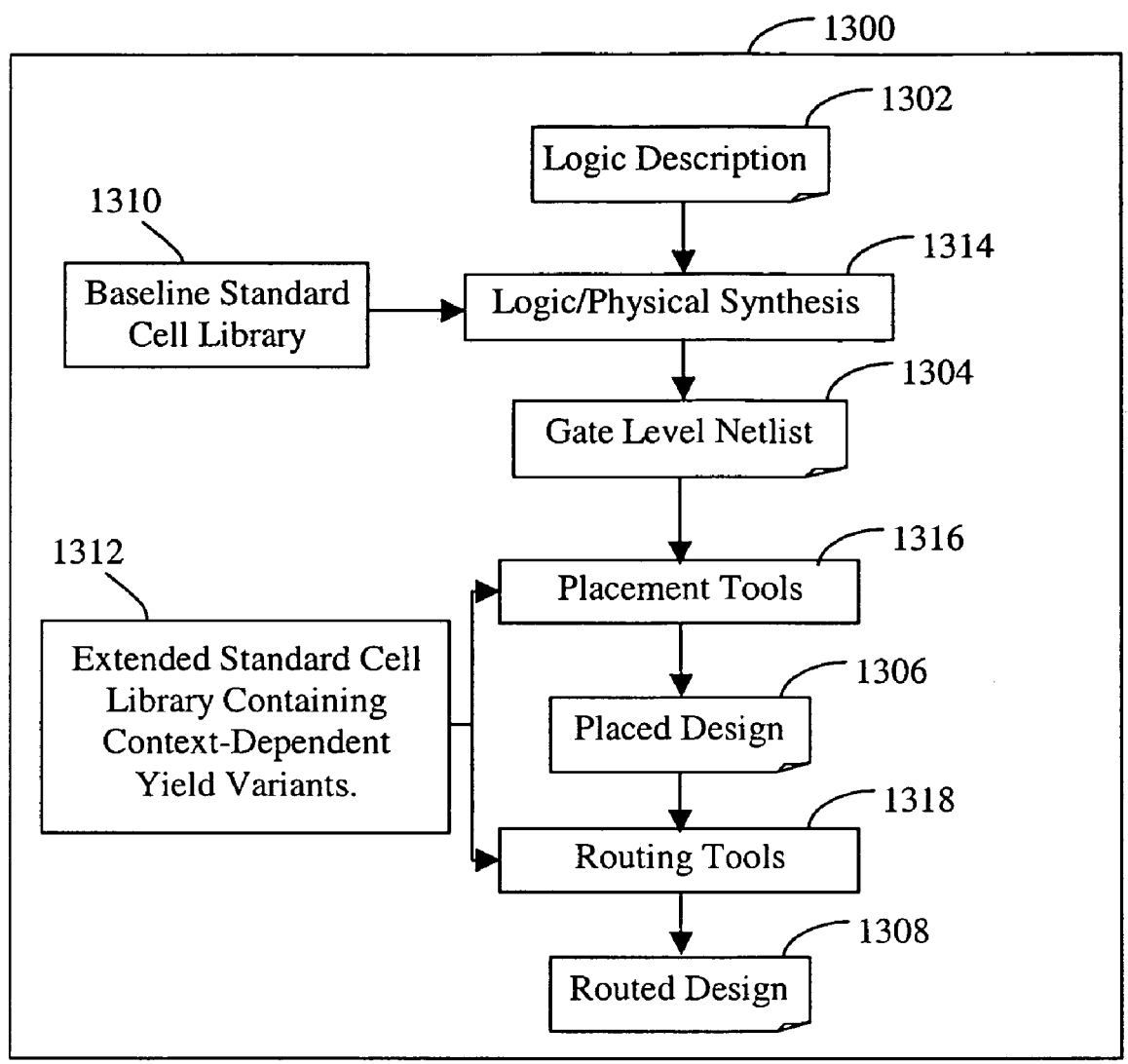
FIG. 13 illustrates some embodiment of standard cell physical design process using context dependent yield standard cell variants.

FIG. 13 illustrates a standard cell design flow process 1300 used by some embodiments of the current invention. The process maximizes the manufacture yield of integrated circuit by using context-dependent standard cell library. The flow is similar to the one shown in FIG. 3, except that an extended library containing context-dependent yield variants 1312 is used in the design flow in addition to a baseline library 1310.

In process 1314, logic or physical synthesis tools in modern days perform floor planning and fast placement in order to achieve timing closure. Here, placement and routing are estimated, but they are not final. Therefore the design context information is irrelevant at this stage, process 1314 is similar to 212 in the sense that electrical characteristics such as timing, power and signal integrity is the main consideration in this process of transferring a logical design representation to a gate-level netlist of cells. A baseline library is used for process 1314, since context-dependent yield information is irrelevant too.

Process 1316 is a detailed placement of a design, in which a placement of each cell is determined. Overlapping between cells is not allowed. In traditional flow such as one shown in FIG. 3, placement 314 is implemented, dependent on an estimated routing, to be optimized for timing, signal integrity or power. In the present invention, placement tools take into consideration of context-dependent yield in addition to these objectives, since the information about the neighbor of each cell is available when the placement is completed. At 1316, placement tools replace each of baseline cells with an appropriate variant of a cell, or leave a baseline cell intact, so that the design converges to a placement solution. In the solution, the yield of each cell, as a function of its context, is consistent across the whole design, and meets the design specifications. It is preferable to select variants of the cells with the same or similar footprint and electrical characteristics so that the timing, power and signal integrity specifications will not be perturbed too much, and thus a convergence is easier to achieve.

Process 1318 is the detailed and final routing of a design, in which all the placed cells are connected, usually by wires on numerous conducting layers, to implement a logic function of the design. In traditional flow such as the one shown in FIG. 3, routing 316 is implemented to optimize timing, power and signal integrity. In the present invention, at 1318 routing tools take into consideration of context-dependent yield. First, conducting layers added by the routing tools should not perturb the context of placed cells if such an alternative approach exists. It adds one more check to the routing process. Second, if conducting layers added by routing tools change context of cells used in the placed design, usually when conducting layers involve layers which are present in the cells, then an engineering change order fix ("ECO") fix is needed to swap in appropriate variants of cells to converge to a solution. The yield of each is consistent across the design, and meets the design specifications. The ECO includes an incremental placement if footprints of the replaced cells and those of their replacements are different and some rerouting if pin locations of the replaced cells and those of their replacements are different. It is preferably to make variants of same cells have same or similar footprint and electrical characteristics so that convergence is easier to be achieved.

Standard Cell Yield Characterization

Figure 14:
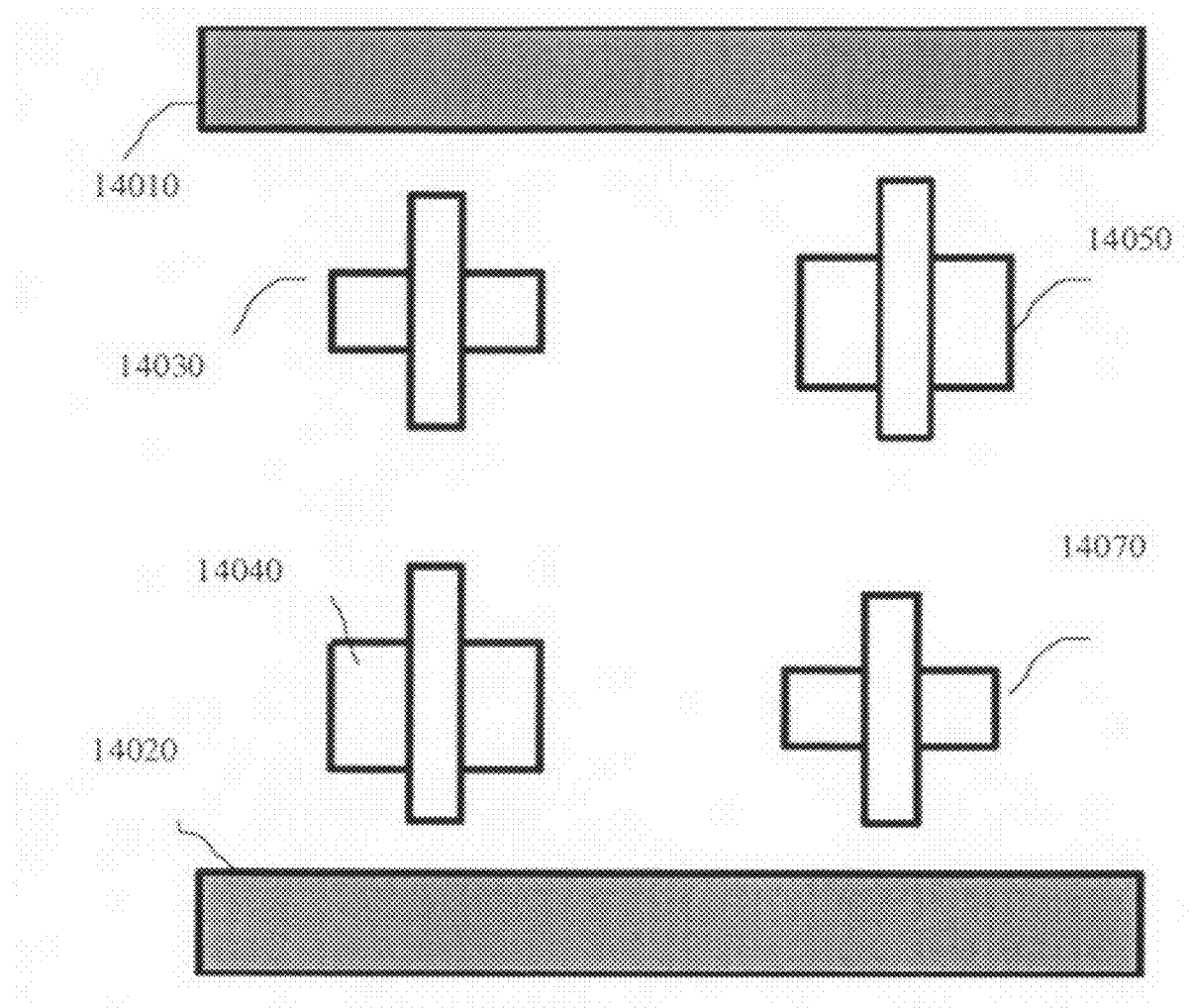
FIG. 14 illustrates some embodiment of standard cell architecture with similar layout structures near the top and bottom boundaries.
Figure 15:
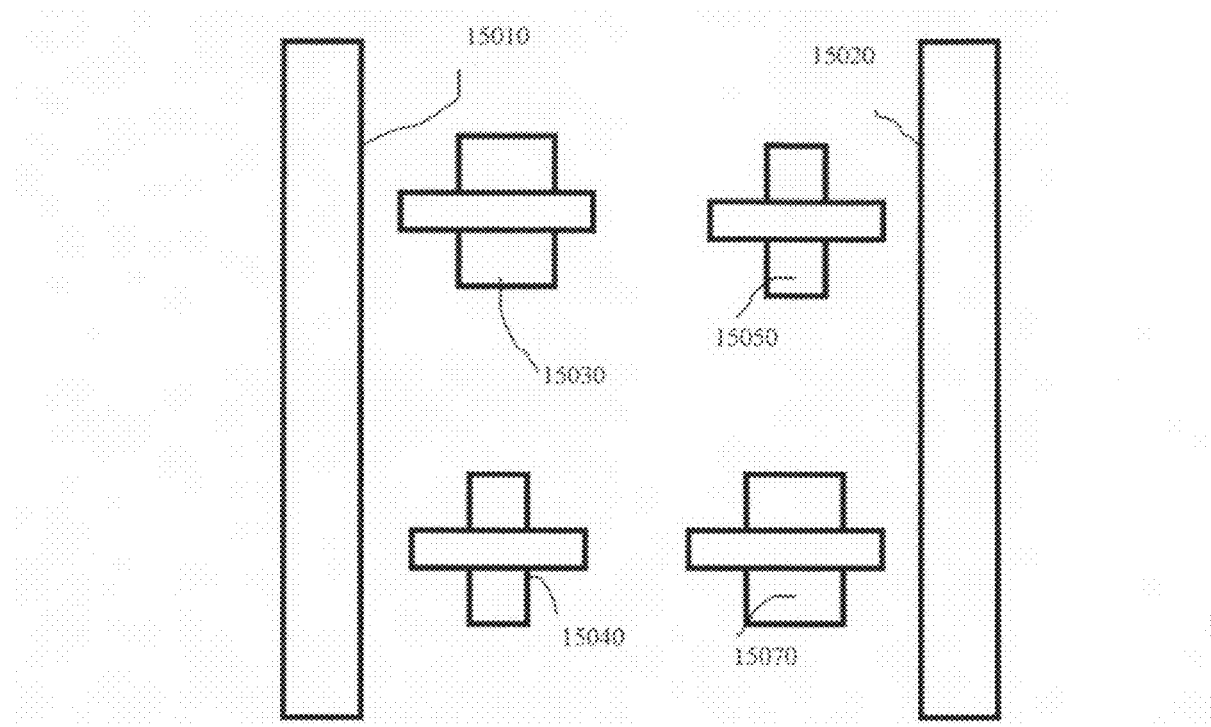
FIG. 15 illustrates some embodiment of a standard cell architecture with similar layout structures near the left and right boundaries.

Some embodiments of ASIC flow of the present invention take advantage of standard cell architectures to achieve computational efficiency. For these embodiments, standard cell layout styles have converged to forms where layout shapes are very similar along two or more cell boundaries. In some embodiments, top and bottom boundaries are very similar for all components in the standard cell library and are typically composed of layout structures for power and ground. FIG. 14 illustrates an example of a standard cell architecture embodiment where power and ground layout structures 14010 and 14020 are located at top and bottom boundaries. 14030-14070 are internal layout objects used to implement a standard cell. FIG. 15 illustrates an example of a standard cell embodiment where the left and right cell boundaries have power and ground structures 15010 and 15020. 15030-15070 are internal layout objects used to implement a standard cell.

The next series of discussion uses as an example a standard cell architecture embodiment with similar layout shapes along the top and bottom boundaries ("top/bottom"). However, one of skill in the art will realize that similar analysis applies to standard cell embodiments with similar layout shapes along the left and right boundaries ("left/right"). The explicit description of how the analysis of top/bottom embodiment applies to that of the left/right will be omitted to avoid obscuring the descriptions.

Figure 16:
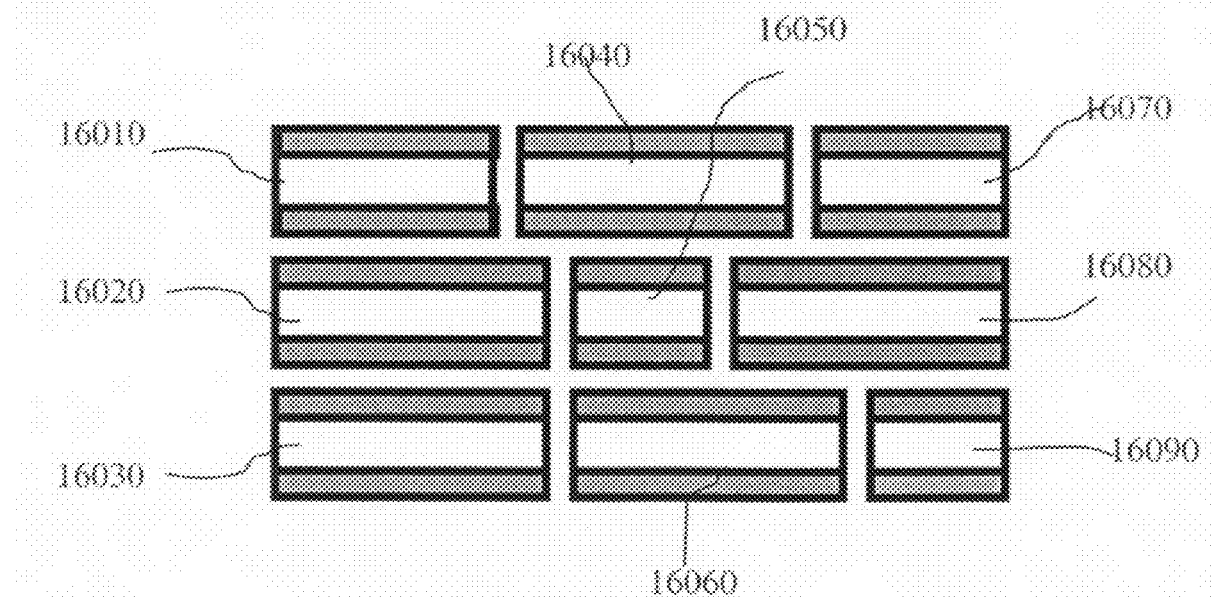
FIG. 16 illustrates an example of placed standard cells with top/bottom common layout structures.

The first implication is that top/bottom layout shapes serve as barriers so that layout shapes present on cells along the top and bottom boundaries will have minimal to no impact on a cell's yield. This implies that left and right adjacent cells are sufficient to define a standard cell's context. FIG. 16 illustrates an example of placed standard cells where cell 16050's context is defined by cell 16020 and 16080. The layout objects from cells 16010, 16030, 16040, 16070, and 16090 are shielded from those of cell 16050 by its top/bottom power and ground layout structures.

Figure 17:
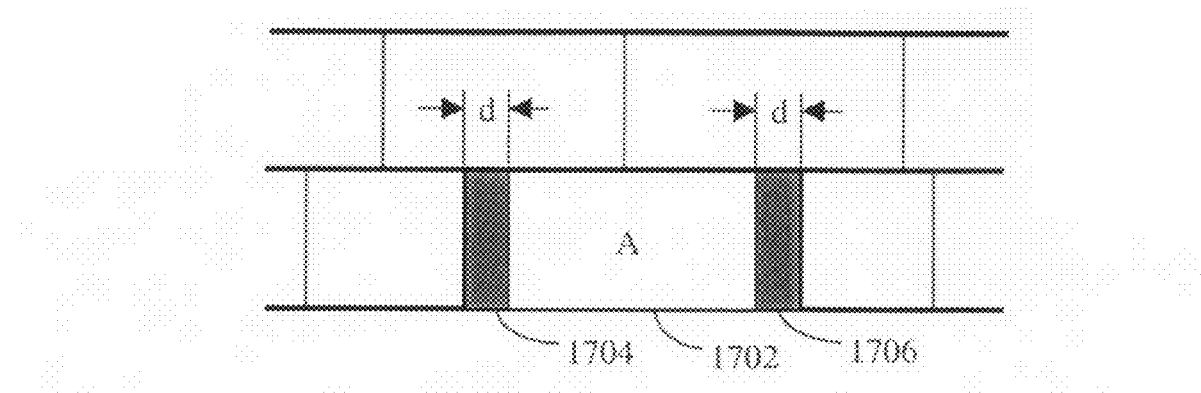
FIG. 17 illustrates the relevant left/right regions for yield characterization of standard cells with top/bottom common structures.

The second implication is that only the portion of the cell that is within the same distance inside a boundary is relevant for context-dependent yield. It is also recognized that shapes over the top of cell in a completed design are generally interconnects on BEOL layers, which is not relevant in the fabrication of FEOL features. Back end of line ("BEOL") are fabrication processing steps involving layers above the silicon layer while Front end of line ("FEOL") are fabrication steps involving the silicon layer. Combining these facts, in the standard cells dependent design, the yield impact of design context for each cell needs only to be characterized for both ends of a cell within certain distance. FIG. 17 illustrates the areas considered for cells in a standard cell dependent design. The shaded areas 1704 and 1706 should be characterized for 1702 an instance of cell A. Distance d is determined by aspects of fabrication process considered in the yield characterization. As discussed above, this distance is generally less than an I/O grid size, and in turn less than the width of any cells including filler cells. That means to calculate context-dependent yield, no further beyond the two neighboring cells has to be inspected.

To capture the characterization of yield dependent on context, a 2-dimensional table of yield values is provided for each variant of every standard cell, with the two dimensions corresponds to design contexts to the left and right ends respectively. An exemplary case to illustrate in a hypothetical format is:

```
cell INV1_variant1 {
    yield {
        table: context_table_a;
        data: {
            0.95, 0.97, 0.98, 0.91, 0.90, 0.98;
            0.96, 0.95, 0.95, 0.93, 0.94, 0.91;
            0.96, 0.94, 0.94, 0.91, 0.93, 0.92;
```

```
            0.91, 0.91, 0.93, 0.94, 0.97, 0.93;
            0.92, 0.94, 0.92, 0.96, 0.90, 0.98;
            0.94, 0.93, 0.91, 0.95, 0.99, 0.93;
        }
    }
}
```

The context table in each dimension is dependent on the design attribute abstracted from the end zones within certain distance of each cell variants. Both distance are the same for the left and right side of a standard cell. Each dimension is exhaustive listings of all possible end zones of all cells variants in the library, including the cell it self, and an empty cell. An exemplary case is:

```
            table {
                name: context_table_a;
                dimension: d_1 {
                empty,
                INV1_base_left,
                INV1_base_right,
                INV1_variant1_left,
                INV1_variant1_right,
                INV1_variant2_left,
                INV1_variant2_right,
                ...,
                INV2_base_left,
                INV2_base_right,
                INV2_variant1_left,
                INV2_variant1_right,
                INV2_variant2_left,
                INV2_variant2_right,
                ...,
                }
                dimension: d_2 {
                empty,
                INV1_base_left,
                INV1_base_right,
                INV1_variant1_left,
                INV1_variant1_right,
                INV1_variant2_left,
                INV1_variant2_right,
                ...,
                INV2_base_left,
                INV2_base_right,
                INV2_variant1_left,
                INV2_variant1_right,
                INV2_variant2_left,
                INV2_variant2_right,
                ...,
                }
            }
```

By using such a table for each cell, physical design tools are able to compute a standard cell's yield as a function of its left and right neighbors.

A further optimization is possible if one observes that a large number of standard cells share similar layout topologies at end-zone regions. For example, the input stages of cells implementing same logic functionality but with different output drive strength are usually identical; the output stages of cells with identical drive strength but different logic functionality are usually identical as well. As a result, the number of unique end zone shapes is much smaller than number of standard cell library components. This results in much smaller number of context configurations for which yield characterizations are required.

Figure 18:
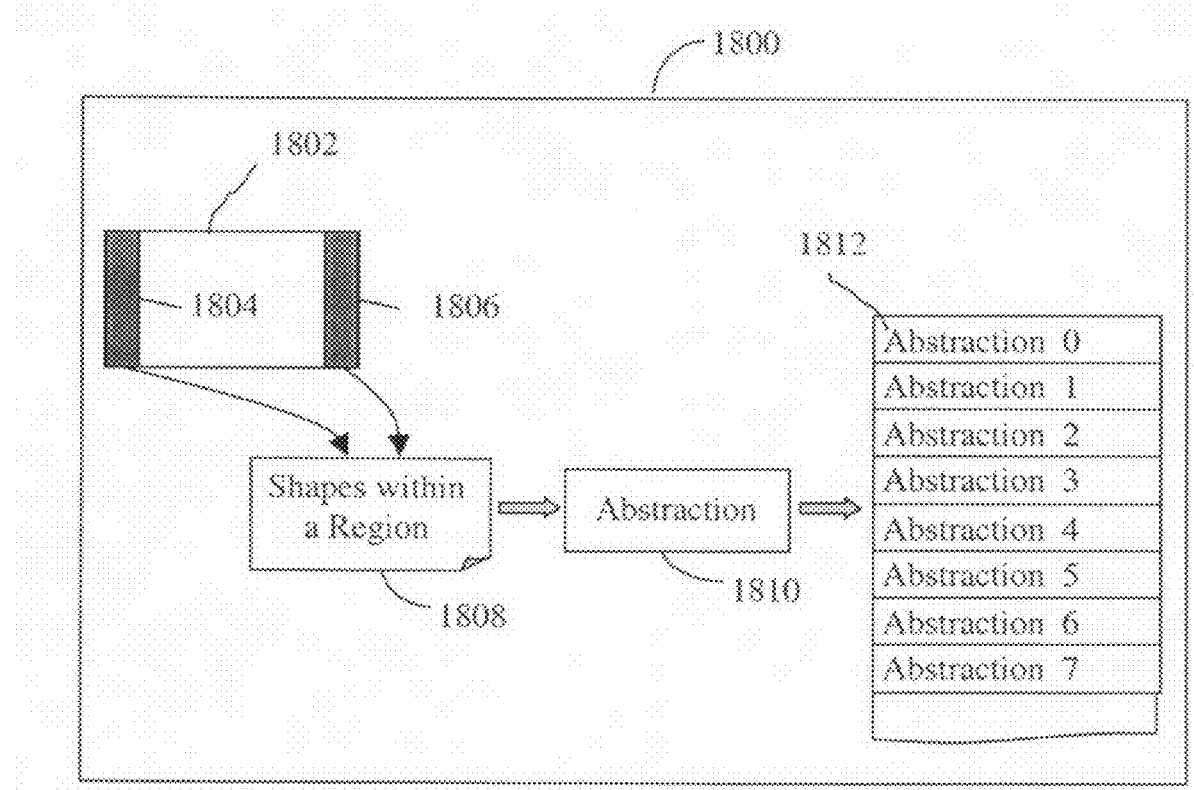
FIG. 18 illustrates some embodiment of process which computes the design attributes for a standard cell.

FIG. 18 illustrates the process 1800 of abstraction of design attributes of shapes in a region. A standard cell 1802 with end zone regions 1804 and 1806 provide input 1808 to the abstraction 1810. At 1810, the process generates a design attribute value contained in 1812. The possible number of values of design attributes is much smaller than the number of cells in a standard cell library. Therefore, the context table size for the cell yield is much smaller. An exemplary case for the context table is:

```
            table {
                name: context_table_a;
                dimension: d_1 {
                0,
                1,
                2,
                3,
                ...,
                }
                dimension: d_2 {
                0,
                1,
                2,
                3,
                ...,
                }
            }
```

Figure 19:
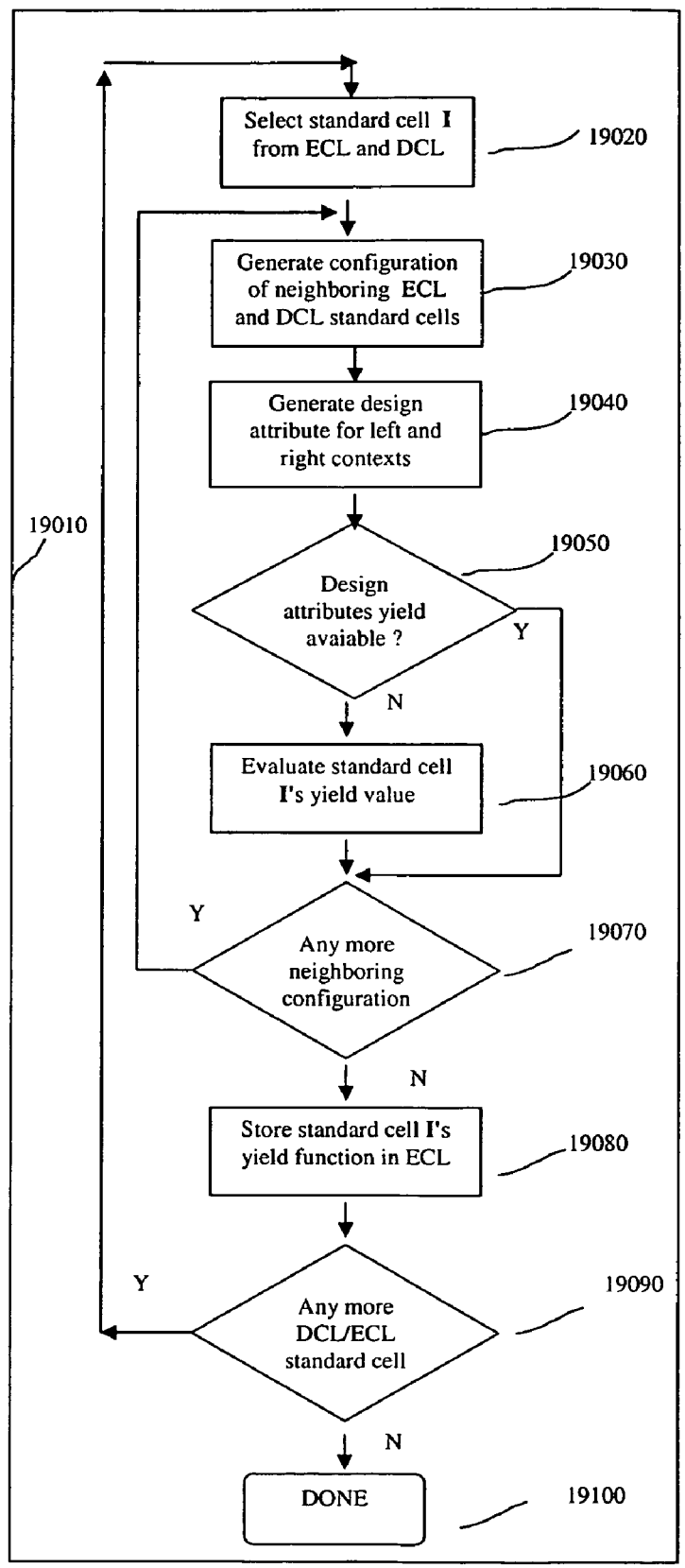
FIG. 19 illustrates some embodiment of a yield characterization process using design attribute context.

FIG. 19 illustrates some embodiment of a process 19010 for characterizing a standard cell component yield using design attributes. At 19020, a standard cell component is selected from the DCL and ECL. At 19030, a left and right context is generated using standard cells drawn from the DCL and ECL. At 19040, the left and right design attributes are computed. At 19050, the process determines if the design attribute contexts have undergone yield characterization. If so, the process skips to 19070. If the design attributes yield characterization is not available, the process continues to 19060 where cell's yield is characterized with context configuration. The process continues to 19070 to determine if any more context configurations have to be evaluated, and returns to 19030 if so. Otherwise, the process stores the standard cell's yield characterization in the ECL at 19080 and continues to 19090 where the process determines if there are additional ECL or DCL standard cells with missing yield characterization data. If so, the process returns to 19020. Otherwise, the process terminates at 19100.

Physical Design with Standard Cell Yield Variants

Figure 20:
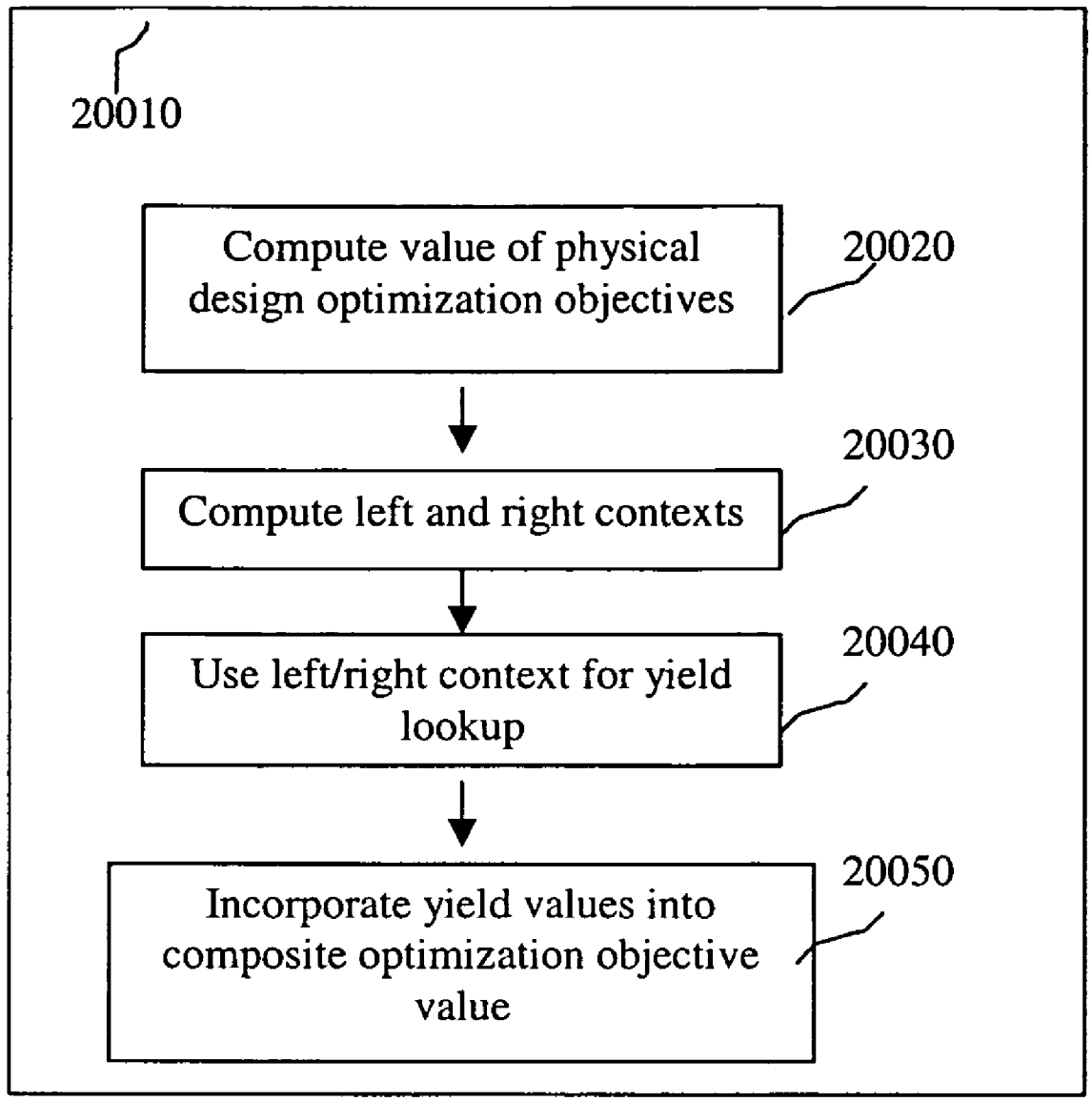
FIG. 20 illustrates some embodiment of context dependent yield standard cell variant physical design process with left/right context computation.

Without the use of design attributes, the physical design process using context dependent yield standard cell variants is similar to embodiment illustrated in FIG. 12. FIG. 20 illustrates some embodiments of physical design process 20010 utilizing context dependent yield variant standard cell flow. At 20020, a physical design process computes the optimization objective using existing art approaches. At 20030, the process computes left and right standard cell context and looks up the yield at 20040. At 20050, the process incorporates standard cell yield information with the existing art physical design optimization objective to form a composite optimization value.

Figure 21:
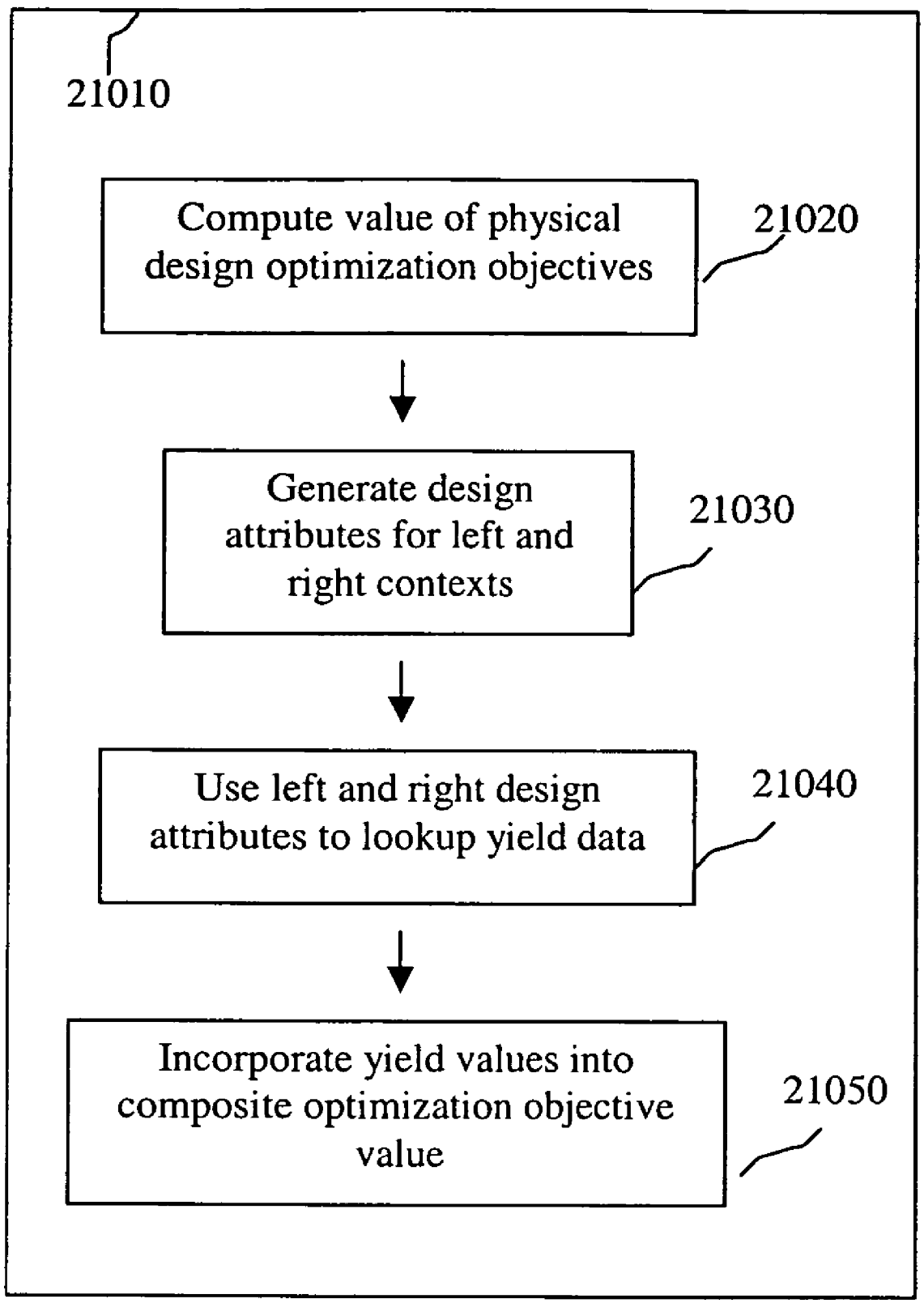
FIG. 21 illustrates some embodiment of context dependent yield standard cell variant physical design process with left/right design attribute computation.

FIG. 21 illustrates some embodiments of physical design process 21010 utilizing the context dependent yield variant flow and context design attributes. As before, the process computes an optimization objective value at 21020 using existing art approaches. At 21030, the process generates design attributes for the left and right contexts and then uses these design attributes to look up standard cell yield values at 21040. At 21050, the process combines the existing art optimization value with standard cell yield values for a composite optimization value.

Memory Blocks

Another embodiment of the present invention is the physical design flow for memory blocks where peripheries are assembled from collection of bit slice components and context dependent yield variants.

Memory Block Flow

Figure 5:
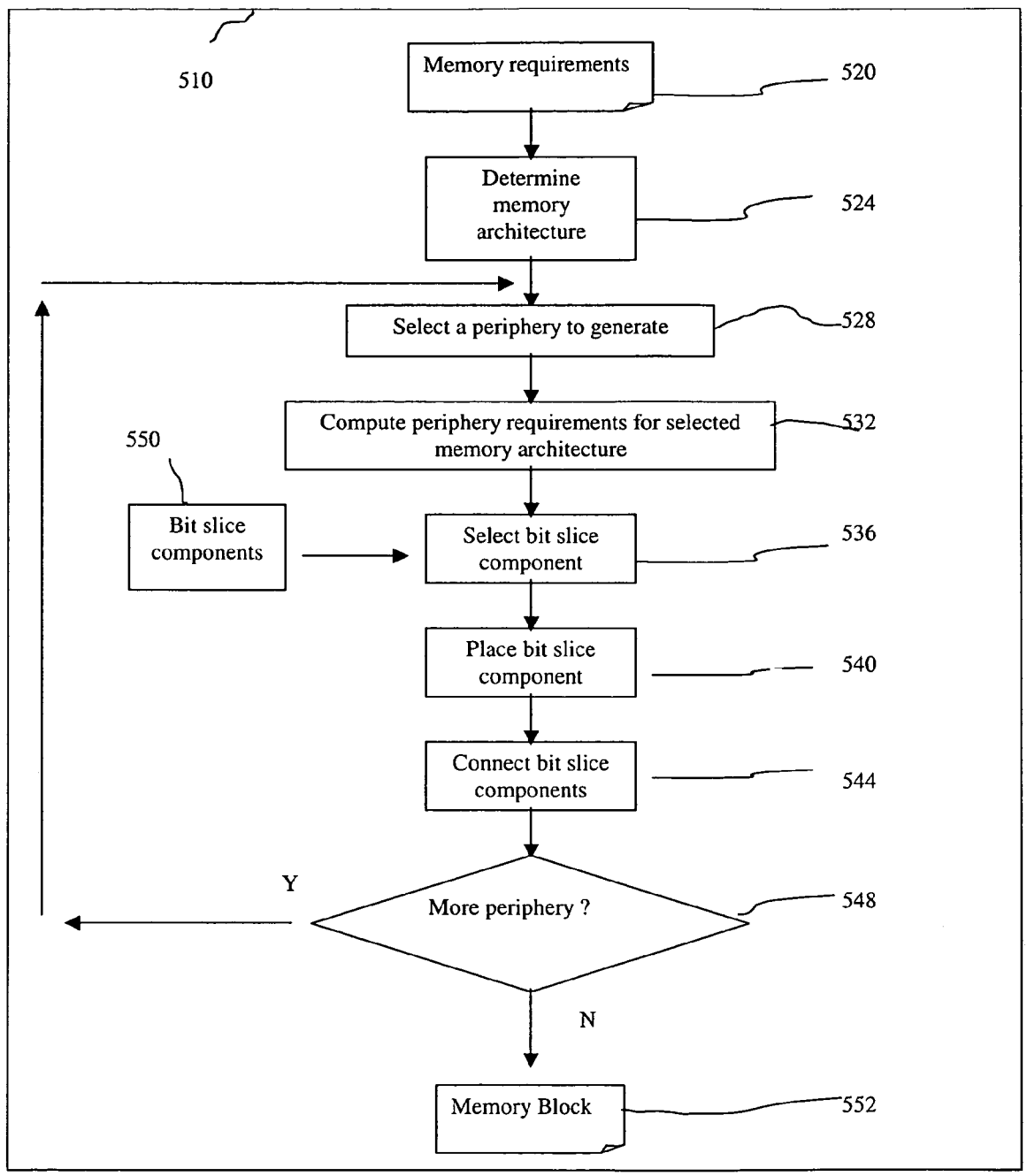
FIG. 5 illustrates some embodiment of a physical design process for generating memory block.
Figure 22:
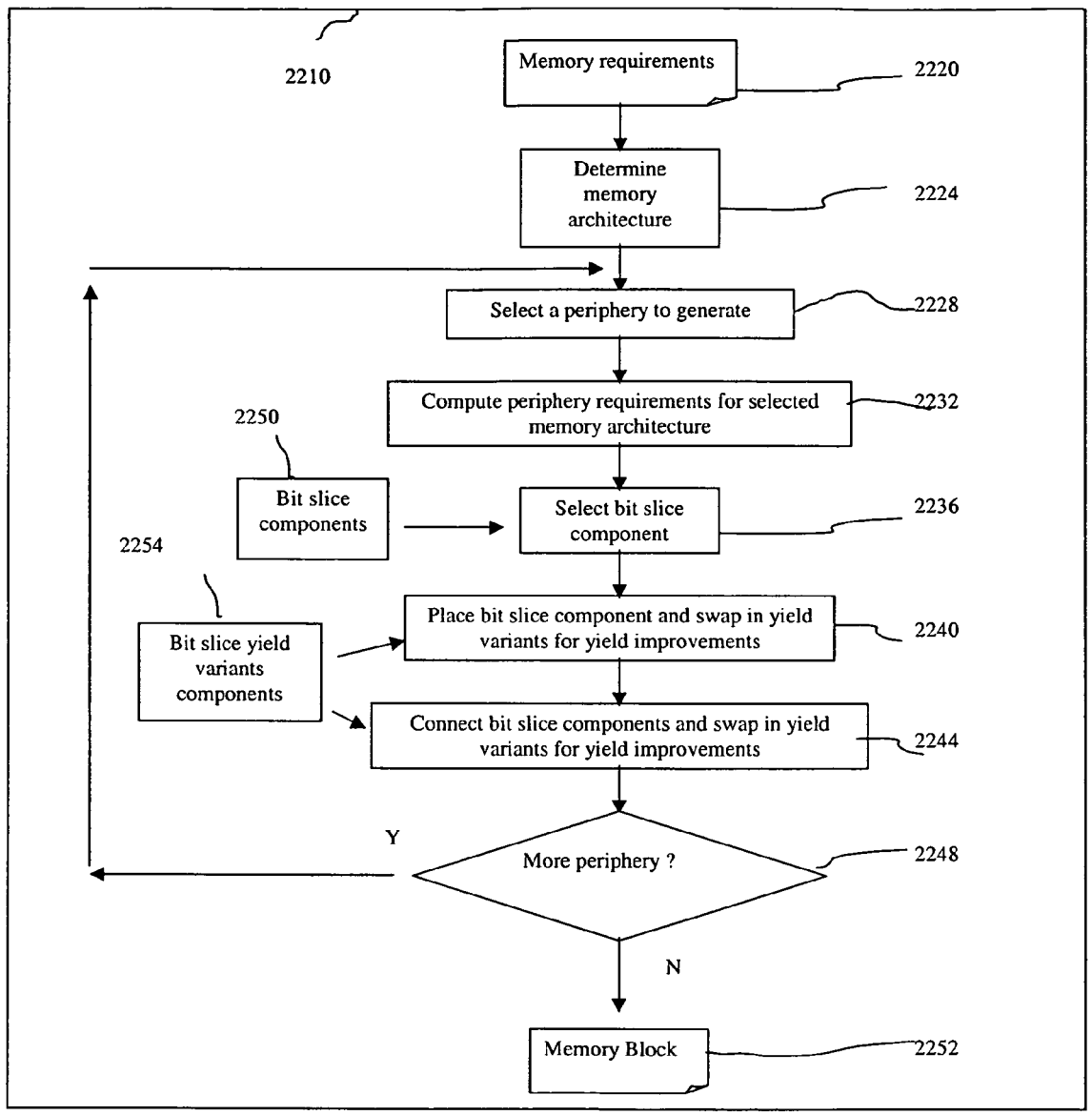
FIG. 22 illustrates some embodiment of a physical design process for generating memory block using context dependent yield bit slice components.

FIG. 22 illustrates memory block physical design flow process 2210 for some embodiment of the present invention. This flow is similar to FIG. 5's process 510 except that bit slice components can be altered during the placement and routing steps. The process at 2224 accepts the memory requirements and determines the memory architecture. At 2228, the process selects a periphery to generate. At 2232, the process computes the periphery requirements and continues to 2236 where bit slice components are selected. At 2240 the process places the components and optionally swaps in yield component variants from 2254 to improve manufacturing yield. At 2244, the process routes the components and optionally swaps in yield variants from 2254 if this results in higher yield values. The process continues to 2248 where the process determines if there are more peripheries to generate. If there is at least one more periphery, the process returns to 2228 to select another periphery to generate. If there are no additional peripheries, the process terminates with a completed memory block 2252.

Although the description above contains many specificities, these should be not be construed as limiting the scope of the invention but merely providing illustrations of some of the presently preferred embodiments of this invention.

Thus the scope of the invention should be determined by the appended claims and their equivalents, rather than by the examples given.

We claim:

1. A method, executed by at least one processor of a computer, for improving an integrated circuit design's manufacturing yield comprising:
   receiving a collection of integrated circuit design components;
   generating one or more variants for each of the integrated circuit design components;
   determining a plurality of context-dependent yield values for each of the integrated circuit design components and the variants, each of the plurality of context-dependent yield values corresponding to a neighboring context in a layout; and
   storing the plurality of context-dependent yield values for each of the integrated circuit design components and the variants in a tangible computer accessible medium.

2. The method as recited in claim 1 further comprising replacing one or more of the integrated circuit design components with their variants to improve the integrated circuit design's manufacturing yield.

3. The method as recited in claim 1 wherein the collection of integrated circuit design components are standard cells.

4. The method as recited in claim 3 wherein the standard cells have similar layout shapes along the standard cells' top and bottom boundaries and the neighboring context is defined by left and right neighboring cells.

5. The method as recited in claim 4 wherein the action of determining comprises:
   computing the plurality of context-dependent yield values for each of the integrated circuit design components and the variants based on different combinations of the left and right neighboring cells; and
   representing the plurality of context-dependent yield values for each of the integrated circuit design components and the variants with a 2-dimensional table indexed with the left and right neighboring cells.

6. The method as recited in claim 3 wherein the standard cells have similar layout shapes along the standard cells' left and right boundaries and the neighboring context is defined by top and bottom neighboring cells.

7. The method as recited in claim 6 wherein the action of determining comprises:
   computing the plurality of context-dependent yield values for each of the integrated circuit design components and the variants based on different combinations of the top and bottom neighboring cells;
   representing the plurality of context-dependent yield values for each of the integrated circuit design components and the variants with a 2-dimensional table indexed with the top and bottom neighboring cells.

8. The method as recited in claim 1 wherein the collection of integrated circuit design components are peripheries.

9. One or more processor readable storage devices, tangibly embodying a program of instructions executable by one or more processors to perform a method for improving an integrated circuit design's manufacturing yield, the method comprising:
   receiving a collection of integrated circuit design components;
   generating one or more variants for each of the integrated circuit design components;
   determining a plurality of context-dependent yield values for each of the integrated circuit design components and the variants, each of the plurality of context-dependent yield values corresponding to a neighboring context in a layout; and
   storing the plurality of context-dependent yield values for each of the integrated circuit design components and the variants in a tangible computer accessible medium.

10. One or more processor readable storage devices as recited in claim 9 wherein the method further comprising replacing one or more of the integrated circuit design components with their variants to improve the integrated circuit design's manufacturing yield.

11. One or more processor readable storage devices as recited in claim 9 wherein the collection of integrated circuit design components are standard cells.

12. One or more processor readable storage devices as recited in claim 11 wherein the standard cells have similar layout shapes along the standard cells' top and bottom boundaries and the neighboring context is defined by left and right neighboring cells.

13. One or more processor readable storage devices as recited in claim 12 wherein the action of determining comprises:
   computing the plurality of context-dependent yield values for each of the integrated circuit design components and the variants based on different combinations of the left and right neighboring cells; and
   representing the plurality of context-dependent yield values for each of the integrated circuit design components and the variants with a 2-dimensional table indexed with the left and right neighboring cells.

14. One or more processor readable storage devices as recited in claim 11 wherein the standard cells have similar layout shapes along the standard cells' left and right boundaries and the neighboring context is defined by top and bottom neighboring cells.

15. One or more processor readable storage devices as recited in claim 14 wherein the action of storing comprises:

computing the plurality of context-dependent yield values for each of the integrated circuit design components and the variants based on different combinations of the top and bottom neighboring cells; and representing the plurality of context-dependent yield values for each of the integrated circuit design components and the variants with a 2-dimensional table indexed with the top and bottom neighboring cells.

16. One or more processor readable storage devices as recited in claim 9 wherein the collection of integrated circuit design components are peripheries.

17. A system performing a method for improving an integrated circuit design's manufacturing yield, the method comprising:

receiving a collection of integrated circuit design components;

generating one or more variants for each of the integrated circuit design components;

determining a plurality of context-dependent yield values for each of the integrated circuit design components and the variants, each of the plurality of context-dependent yield values corresponding to a neighboring context in a layout; and storing the plurality of context-dependent yield values for each of the integrated circuit design components and the variants in a tangible computer accessible medium.

18. The system as recited in claim 17 wherein the method further comprising replacing one or more of the integrated circuit design components with their variants to improve the integrated circuit design's manufacturing yield.

19. The system as recited in claim 17 wherein the collection of integrated circuit design components are standard cells.

20. The system as recited in claim 17 wherein the collection of integrated circuit design components are peripheries.

* * * * *